(12) United States Patent
Feng et al.

(10) Patent No.: US 8,866,267 B2
(45) Date of Patent: Oct. 21, 2014

(54) SEMICONDUCTOR DEVICE WITH SUBSTRATE-SIDE EXPOSED DEVICE-SIDE ELECTRODE AND METHOD OF FABRICATION

(75) Inventors: Tao Feng, Santa Clara, CA (US); Anup Bhalla, Santa Clara, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 780 days.

(21) Appl. No.: 12/790,773

(22) Filed: May 28, 2010

(65) Prior Publication Data

US 2011/0291245 A1 Dec. 1, 2011

(51) Int. Cl.
| | |
|---|---|
| H01L 29/40 | (2006.01) |
| H01L 29/78 | (2006.01) |
| H01L 29/423 | (2006.01) |
| H01L 29/66 | (2006.01) |
| H01L 23/48 | (2006.01) |
| H01L 29/06 | (2006.01) |
| H01L 23/00 | (2006.01) |
| H01L 29/417 | (2006.01) |

(52) U.S. Cl.
CPC ... *H01L 29/0657* (2013.01); *H01L 2924/01082* (2013.01); *H01L 2924/01047* (2013.01); *H01L 2224/06102* (2013.01); *H01L 2224/48247* (2013.01); *H01L 2224/05571* (2013.01); *H01L 2224/32245* (2013.01); *H01L 2224/48465* (2013.01); *H01L 24/48* (2013.01); *H01L 2924/13055* (2013.01); *H01L 2224/48463* (2013.01); *H01L 29/7813* (2013.01); *H01L 2924/01033* (2013.01); *H01L 2224/06051* (2013.01); *H01L 2924/01079* (2013.01); *H01L 2224/92247* (2013.01); *H01L 2924/3011* (2013.01); *H01L 2924/01006* (2013.01); *H01L 29/41741* (2013.01); *H01L 2924/01005* (2013.01); *H01L 29/42372* (2013.01); *H01L 24/03* (2013.01); *H01L 2924/01013* (2013.01); *H01L 24/06* (2013.01); *H01L 2924/014* (2013.01); *H01L 29/66734* (2013.01); *H01L 23/481* (2013.01); *H01L 2224/29006* (2013.01); *H01L 24/05* (2013.01); *H01L 2924/01075* (2013.01); *H01L 2224/0603* (2013.01); *H01L 2924/13091* (2013.01); *H01L 2224/0557* (2013.01); *H01L 2224/73265* (2013.01); *H01L 2224/49107* (2013.01); *H01L 29/781* (2013.01)

USPC ............. 257/621; 438/667; 257/E21.59

(58) Field of Classification Search
USPC .................................................. 257/621
See application file for complete search history.

(56) References Cited

U.S. PATENT DOCUMENTS

| | | | |
|---|---|---|---|
| 2006/0261446 A1* | 11/2006 | Wood et al. | 257/621 |
| 2009/0224313 A1* | 9/2009 | Burke | 257/330 |

* cited by examiner

*Primary Examiner* — Wensing Kuo
*Assistant Examiner* — Shaka White
(74) *Attorney, Agent, or Firm* — Chein-Hwa Tsao; CH Emily LLC

(57) ABSTRACT

A semiconductor device with substrate-side exposed device-side electrode (SEDE) is disclosed. The semiconductor device has semiconductor substrate (SCS) with device-side, substrate-side and semiconductor device region (SDR) at device-side. Device-side electrodes (DSE) are formed for device operation. A through substrate trench (TST) is extended through SCS, reaching a DSE turning it into an SEDE. The SEDE can be interconnected via conductive interconnector through TST. A substrate-side electrode (SSE) and a windowed substrate-side passivation (SSPV) atop SSE can be included. The SSPV defines an area of SSE for spreading solder material during device packaging. A device-side passivation (DSPV) beneath thus covering the device-side of SEDE can be included. A DSE can also include an extended support ledge, stacked below an SEDE, for structurally supporting it during post-wafer processing packaging. The projected footprint of extended support ledge onto the major SCS plane can essentially enclose the correspondingly projected footprint of SEDE.

18 Claims, 15 Drawing Sheets

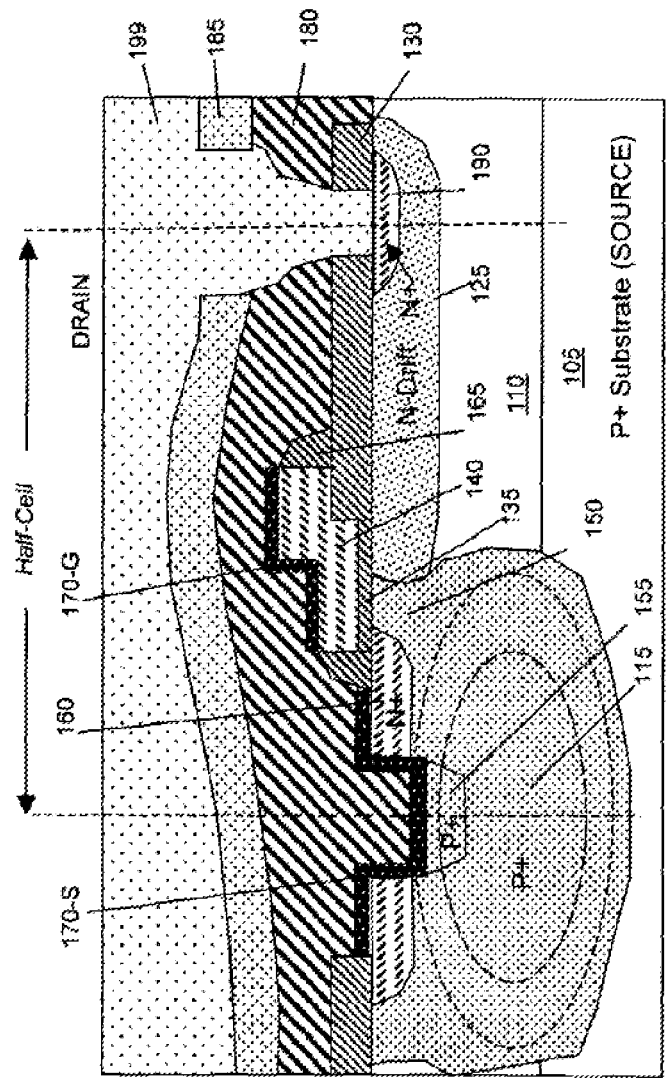
Fig. A Prior Art

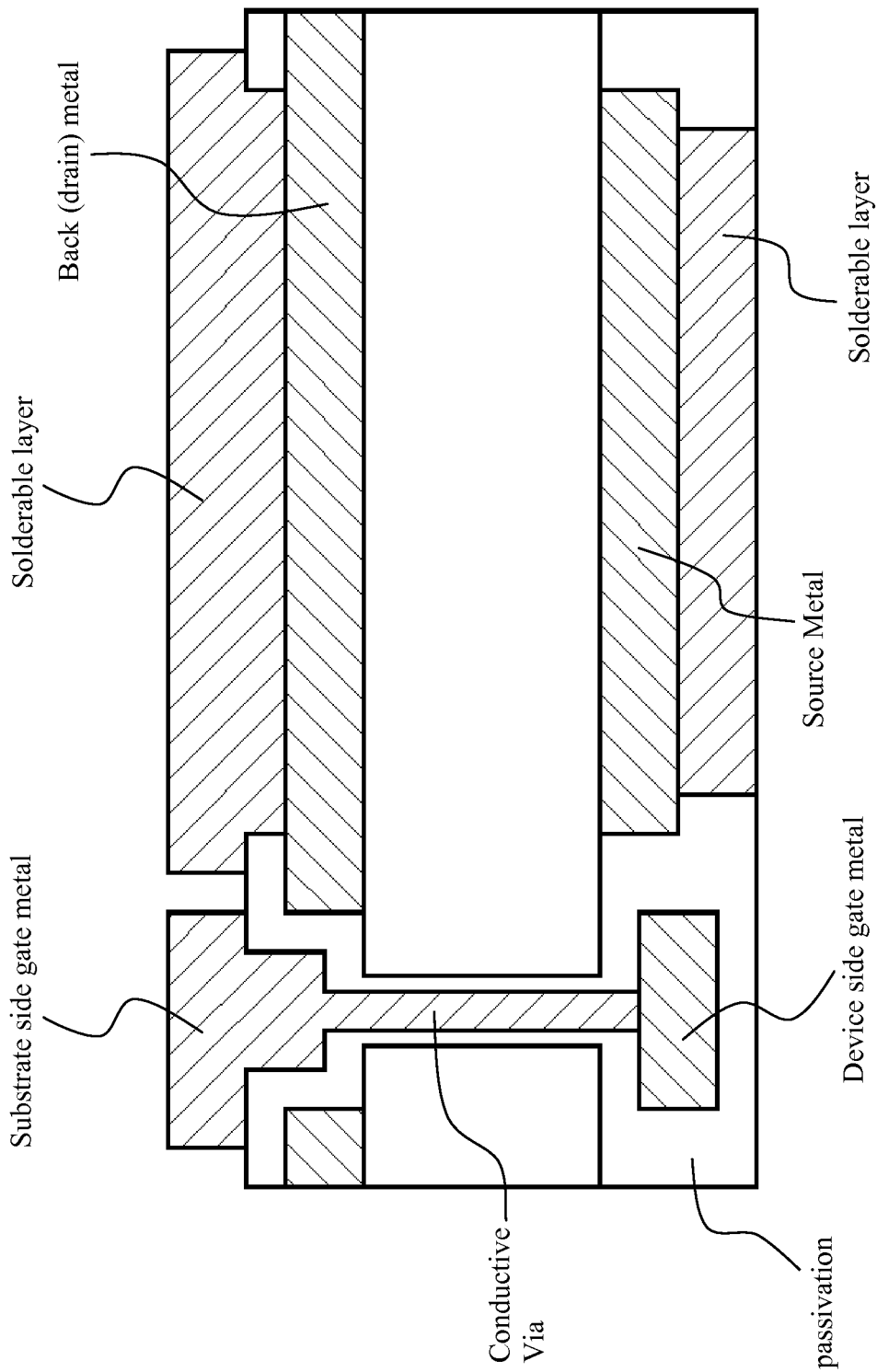
Fig. B Prior Art

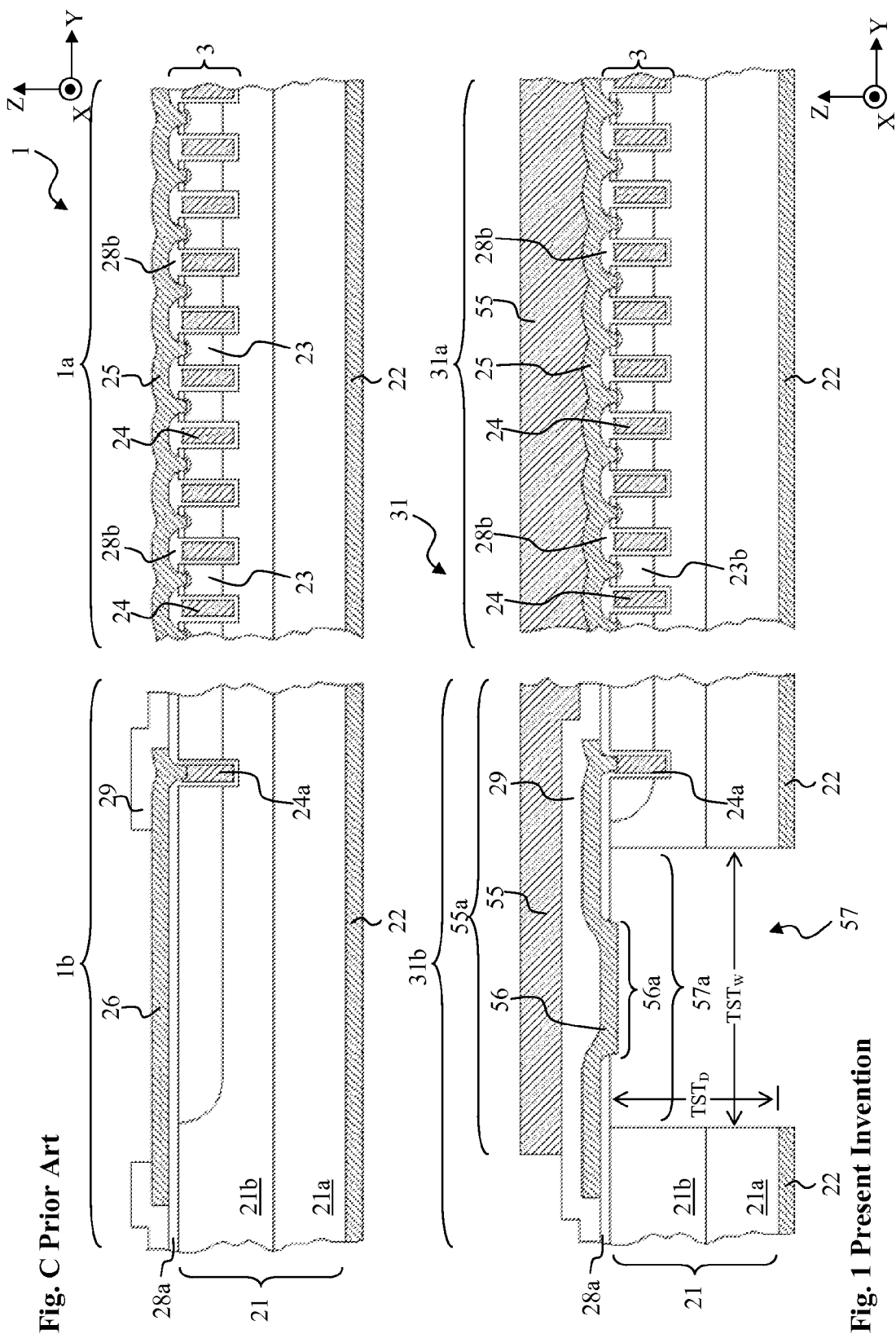

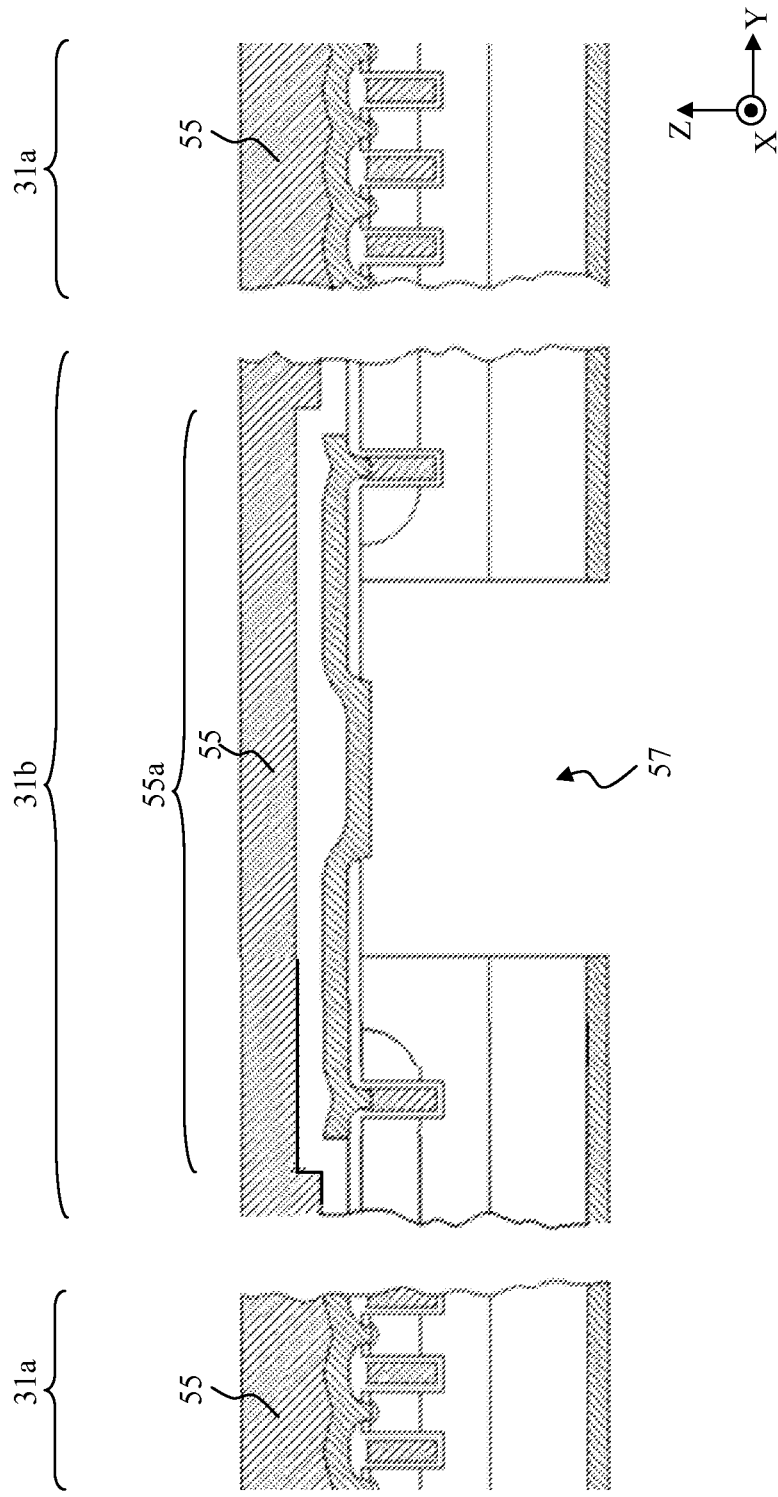
Fig. 1A Present Invention

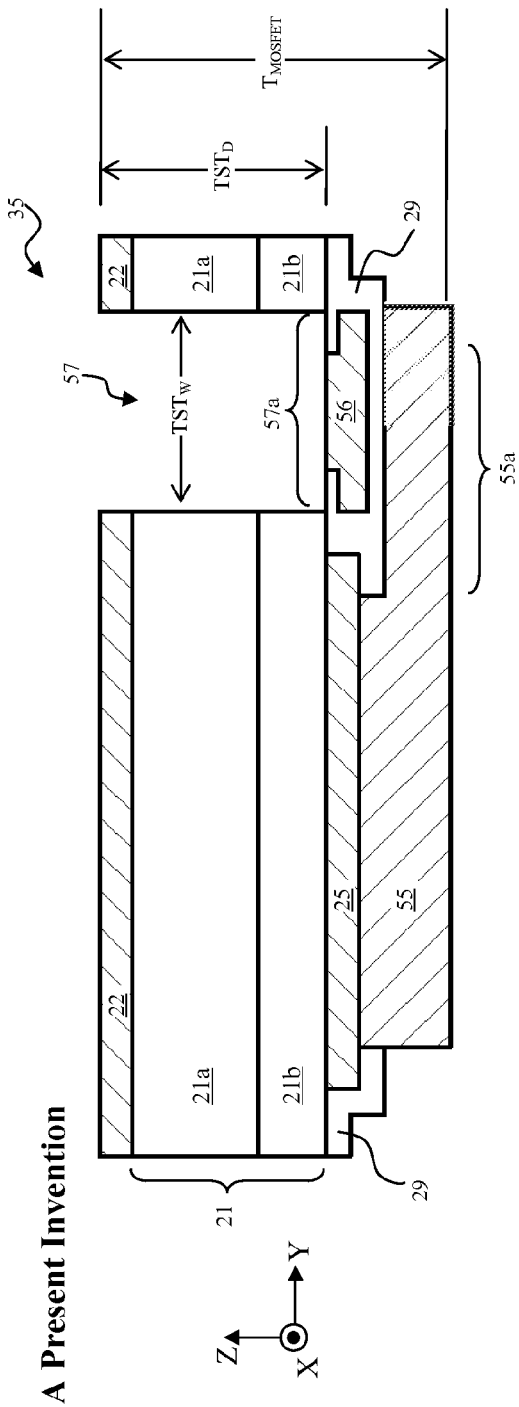
Fig. 2A Present Invention
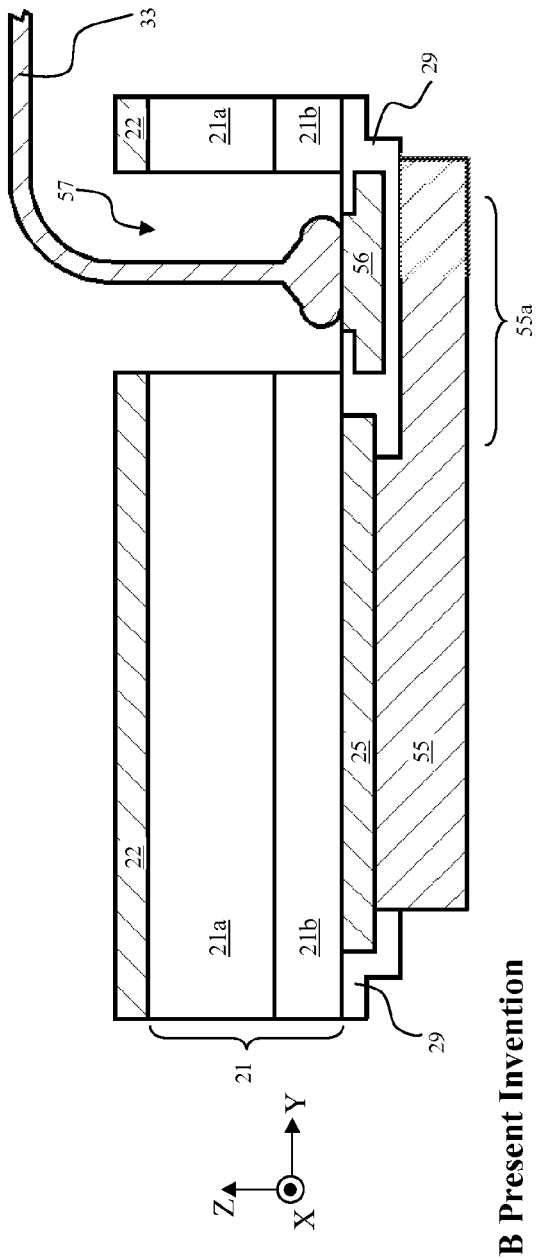
Fig. 2B Present Invention

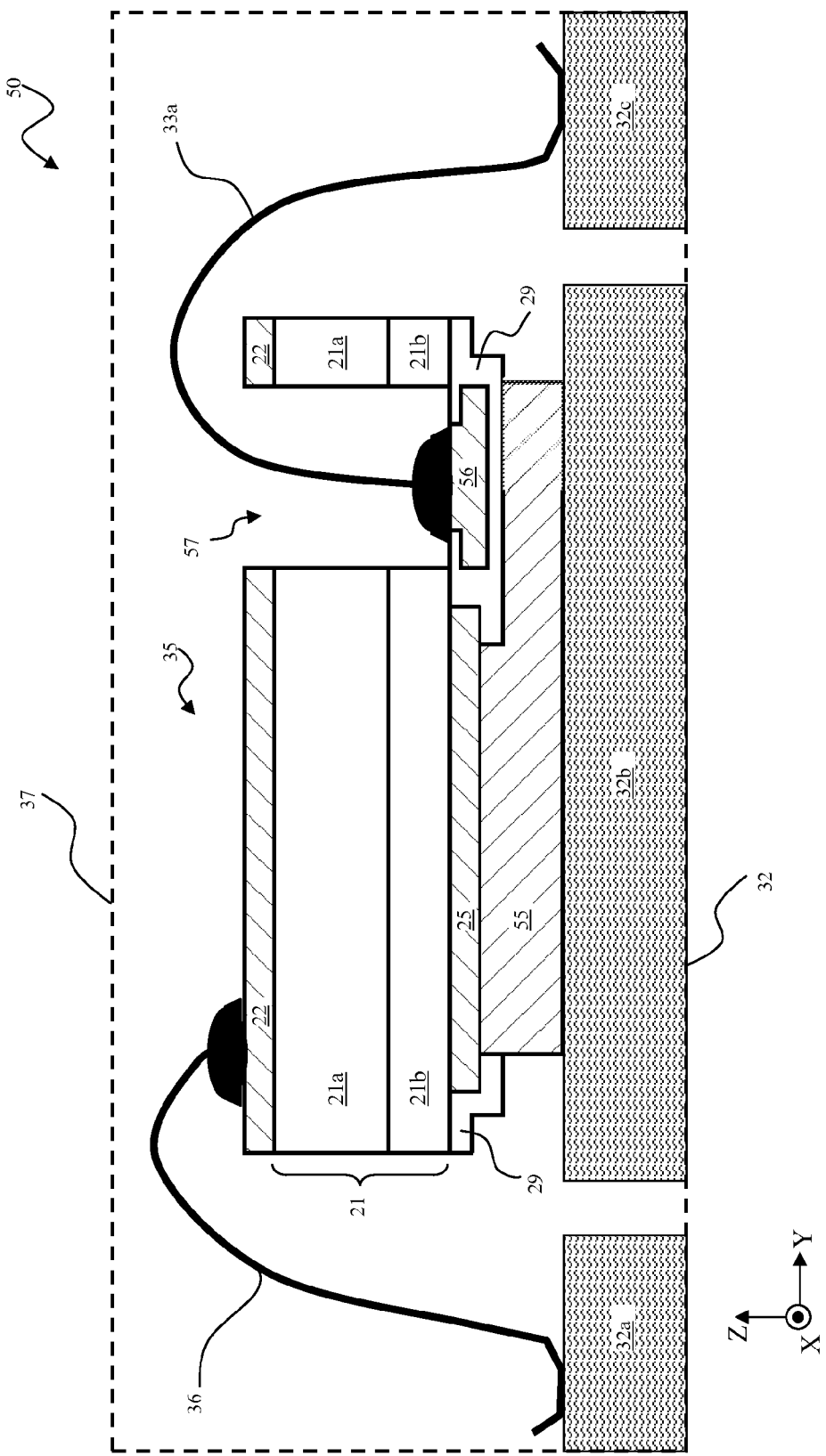
Fig. 2C Present Invention

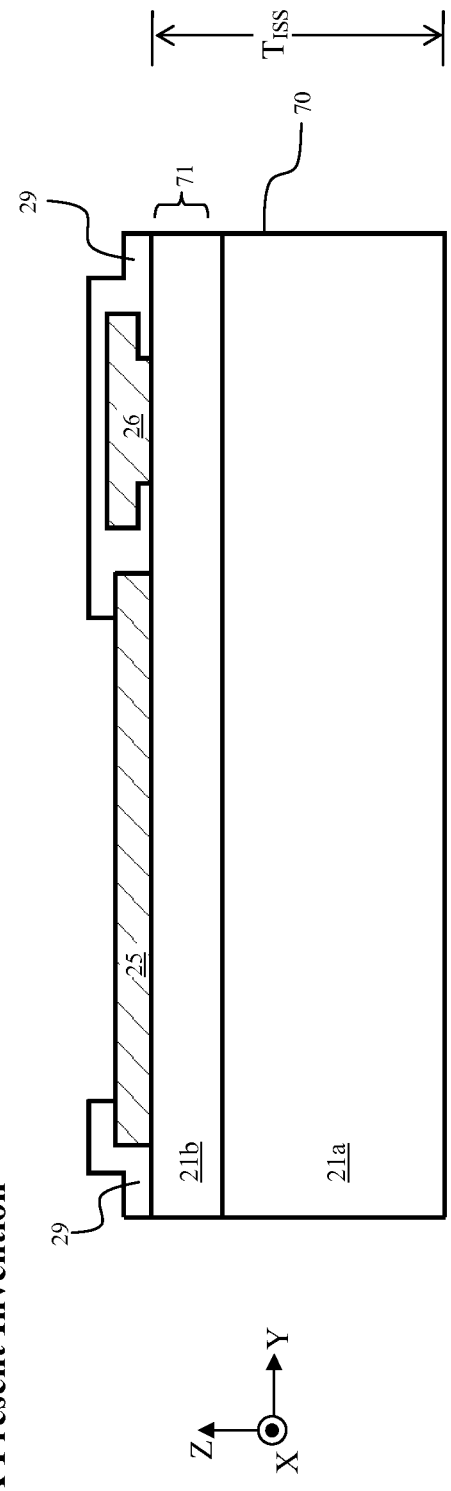
Fig. 3A Present Invention
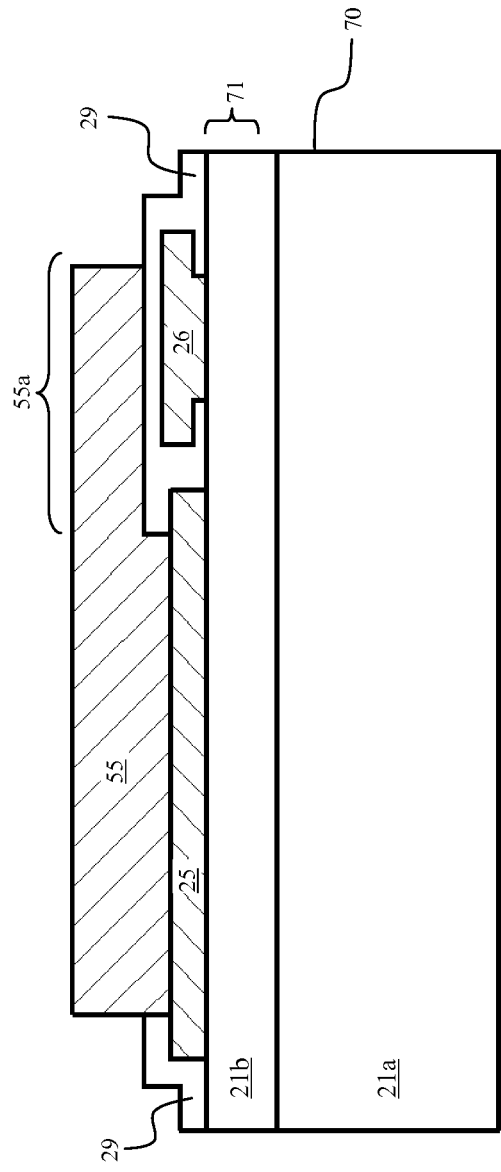
Fig. 3B Present Invention

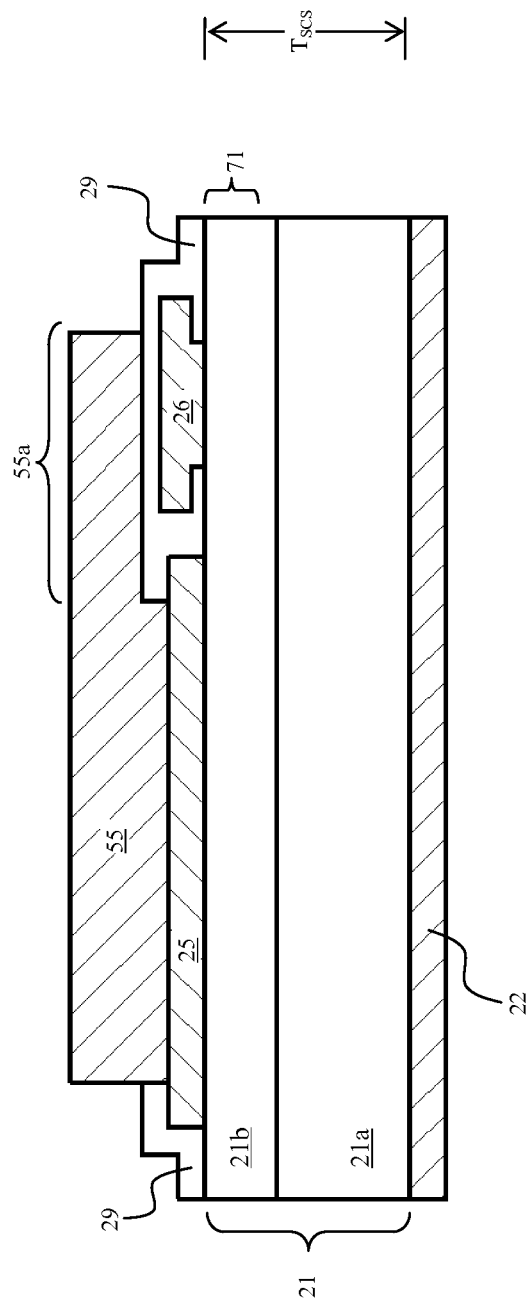
Fig. 3C Present Invention

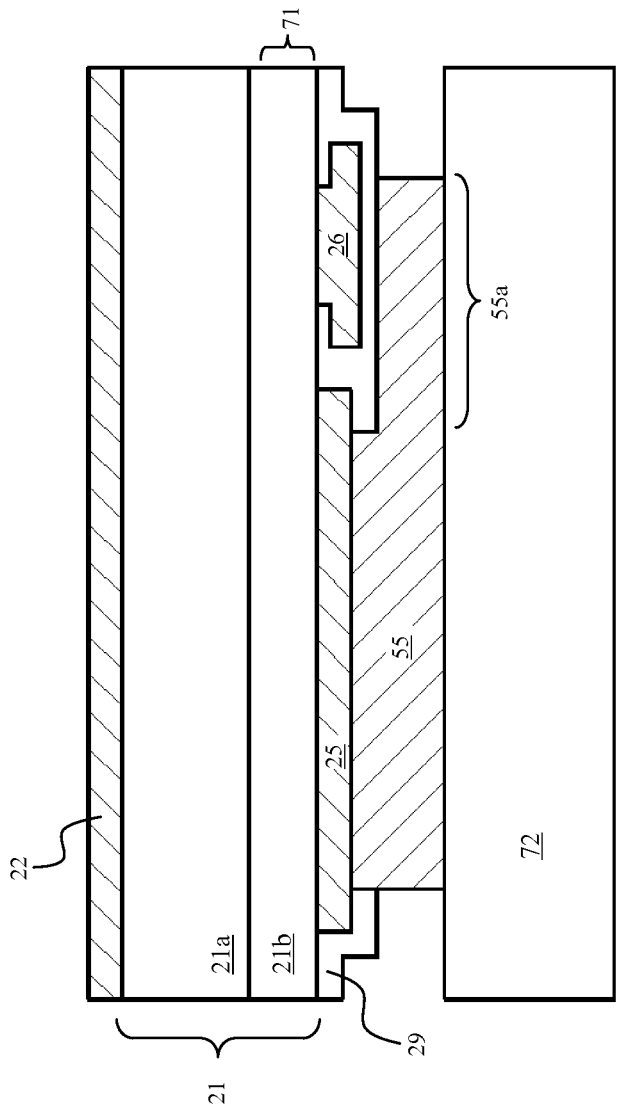
Fig. 3D Present Invention

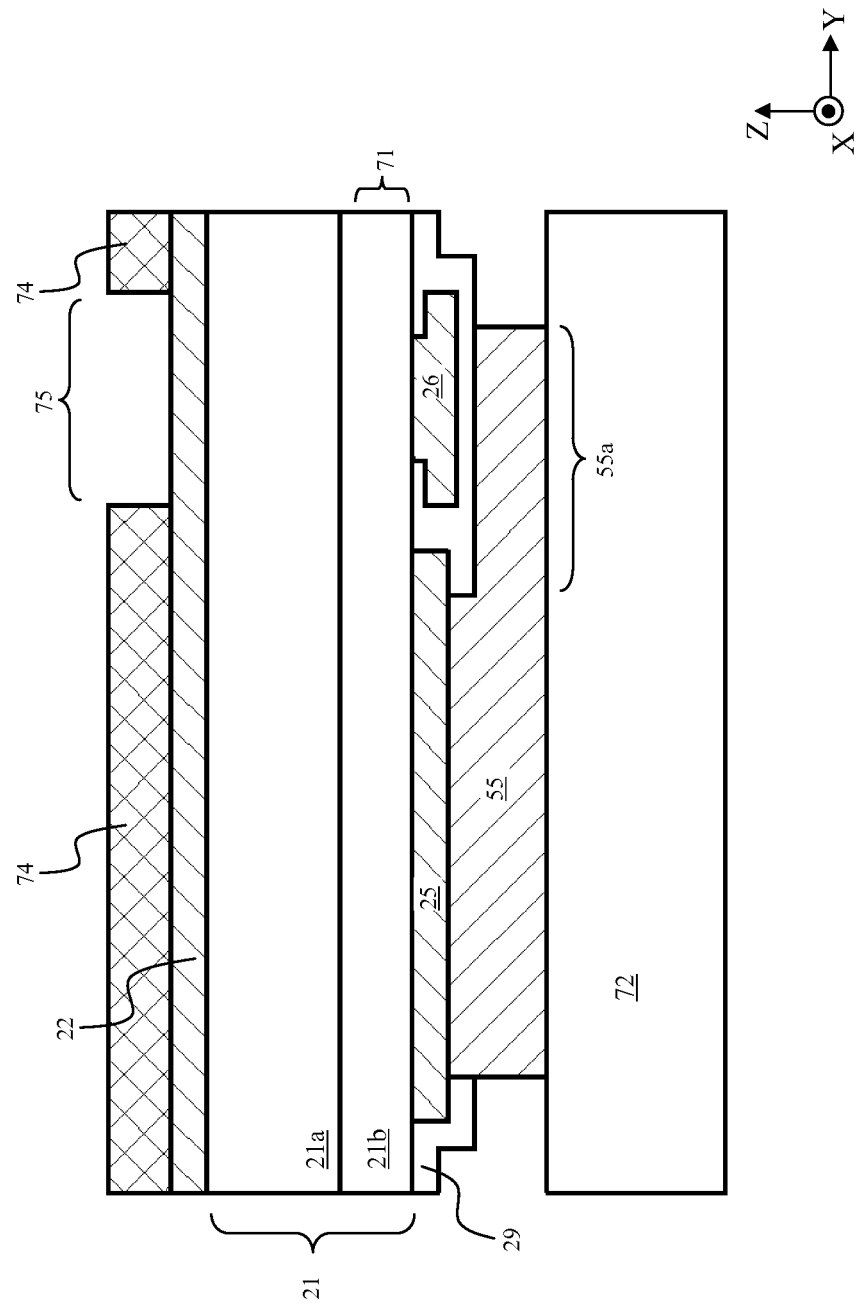
Fig. 3E Present Invention

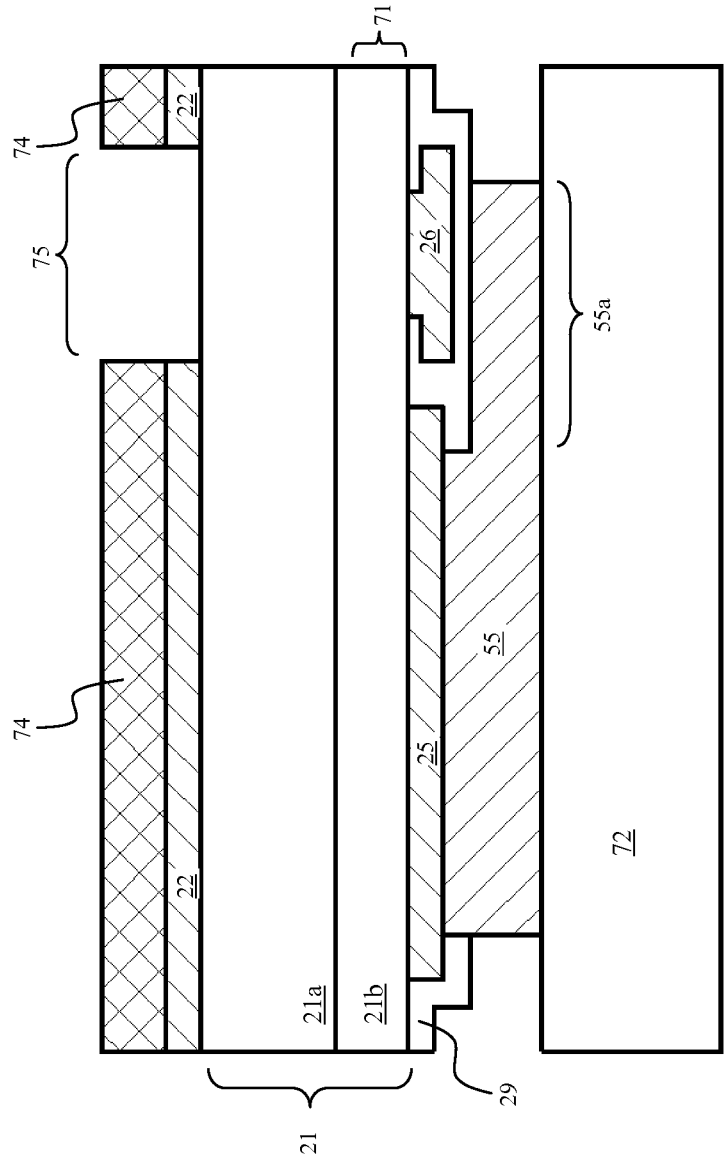
Fig. 3F Present Invention

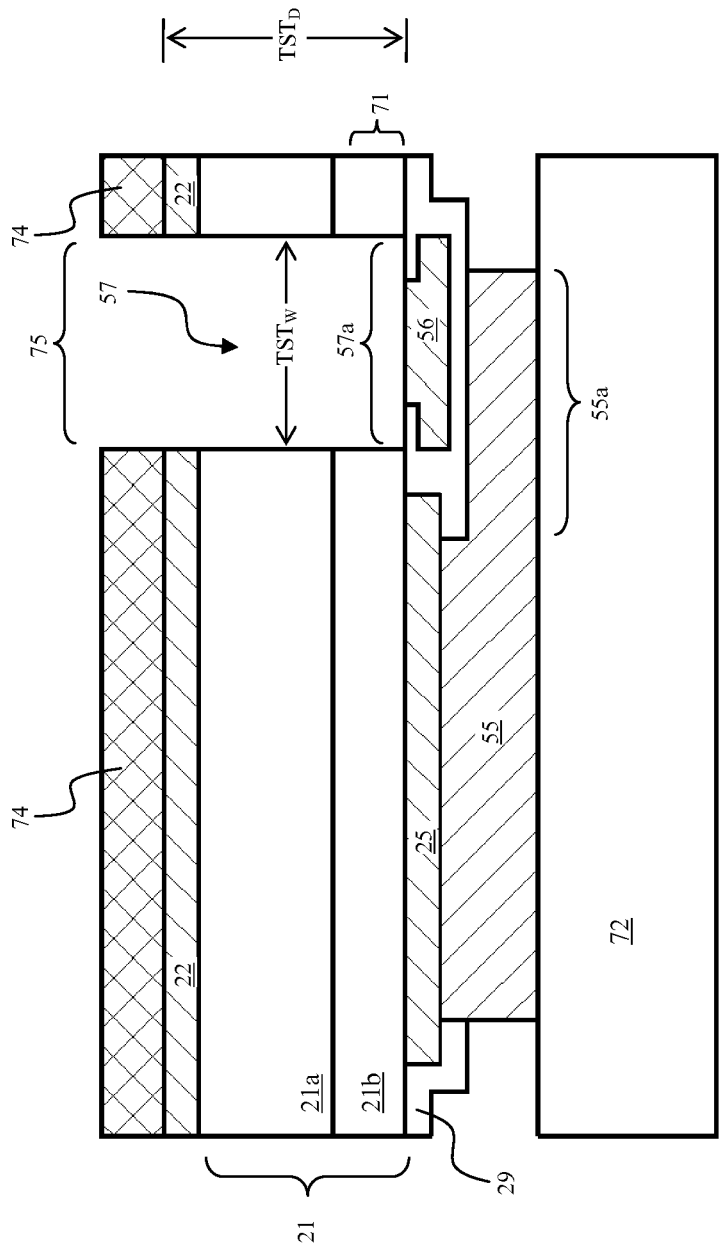
Fig. 3G Present Invention

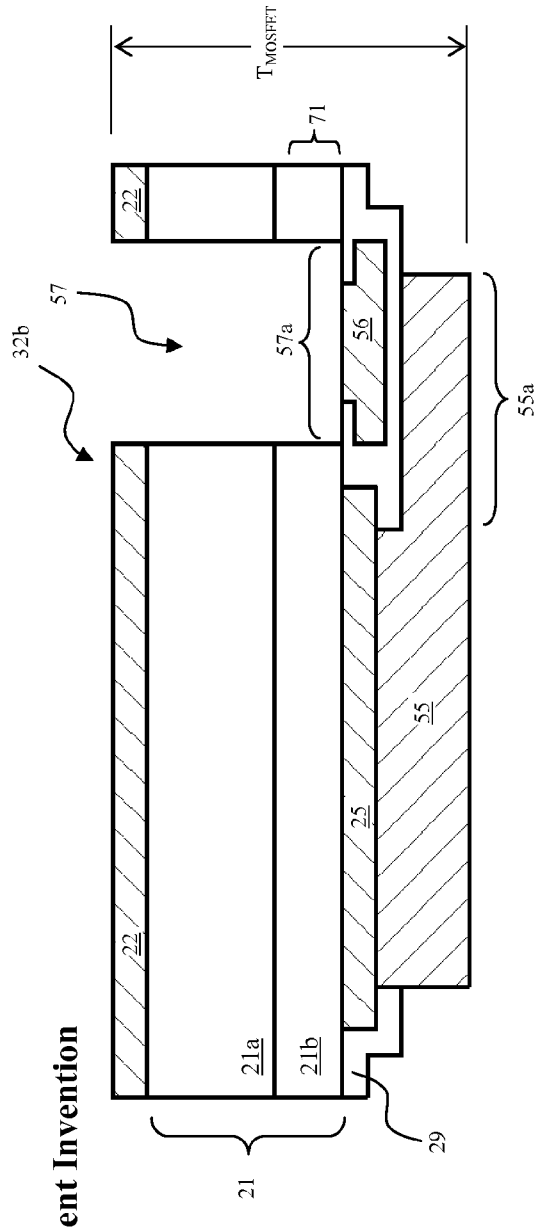
Fig. 3H Present Invention
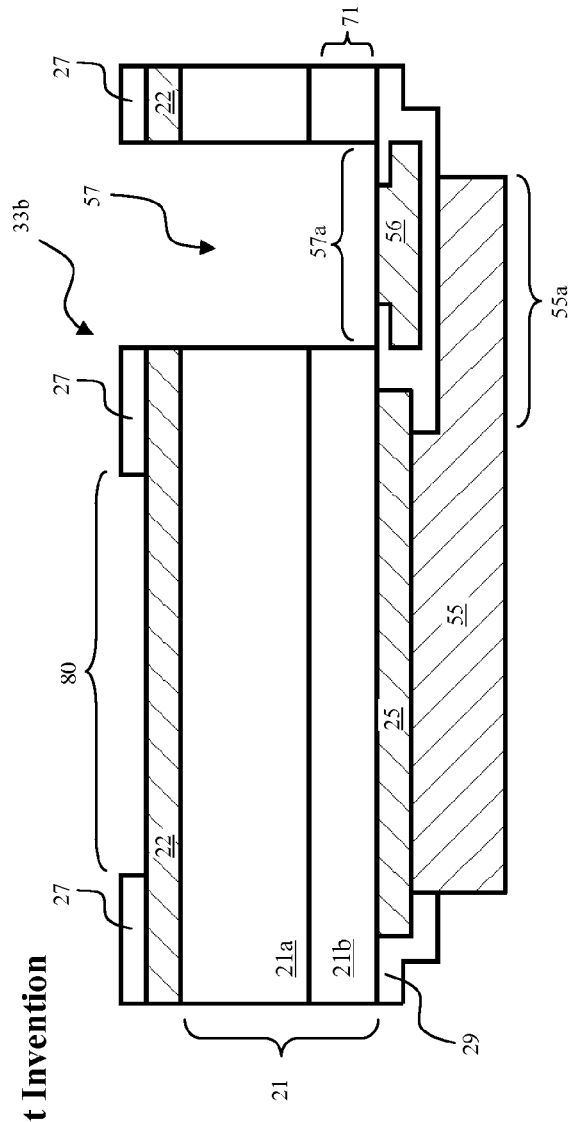
Fig. 4 Present Invention

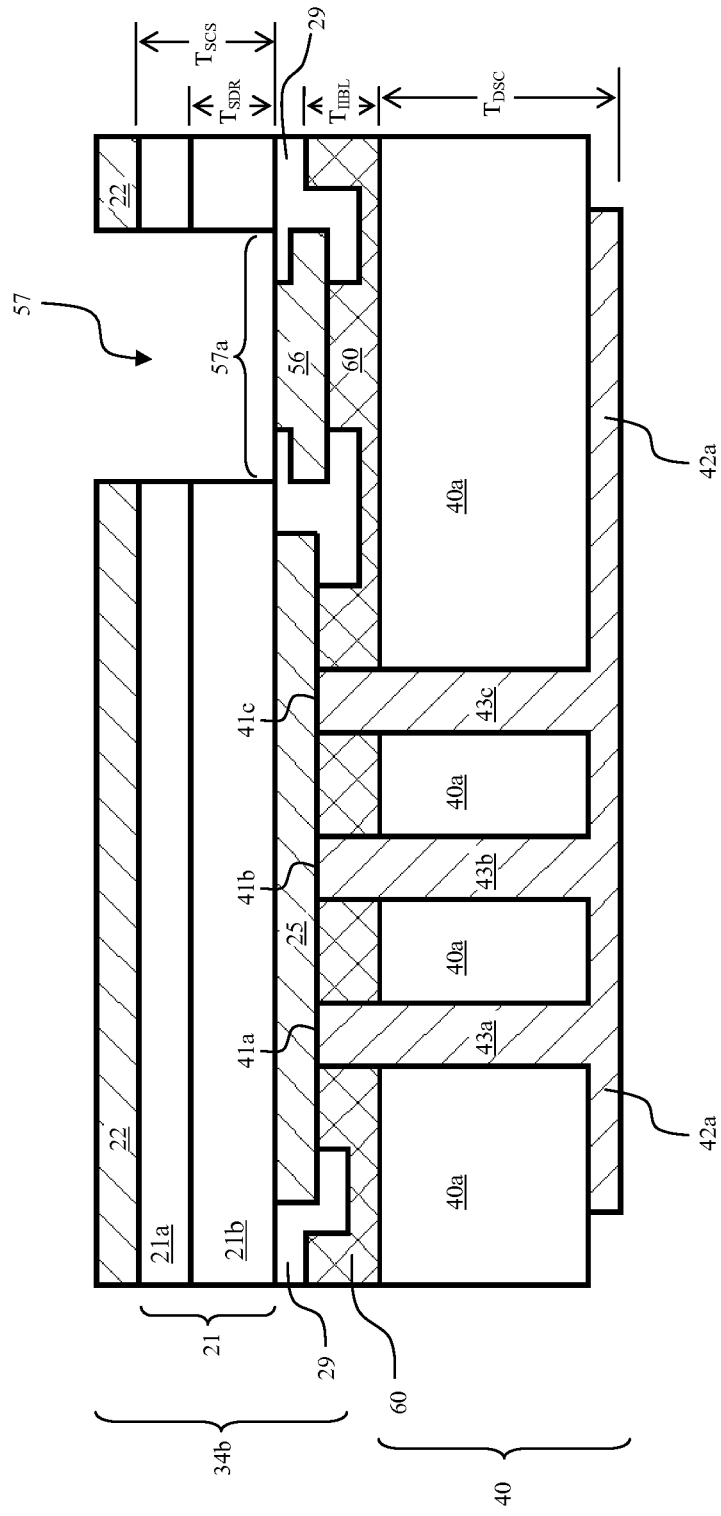
Fig. 5 Present Invention

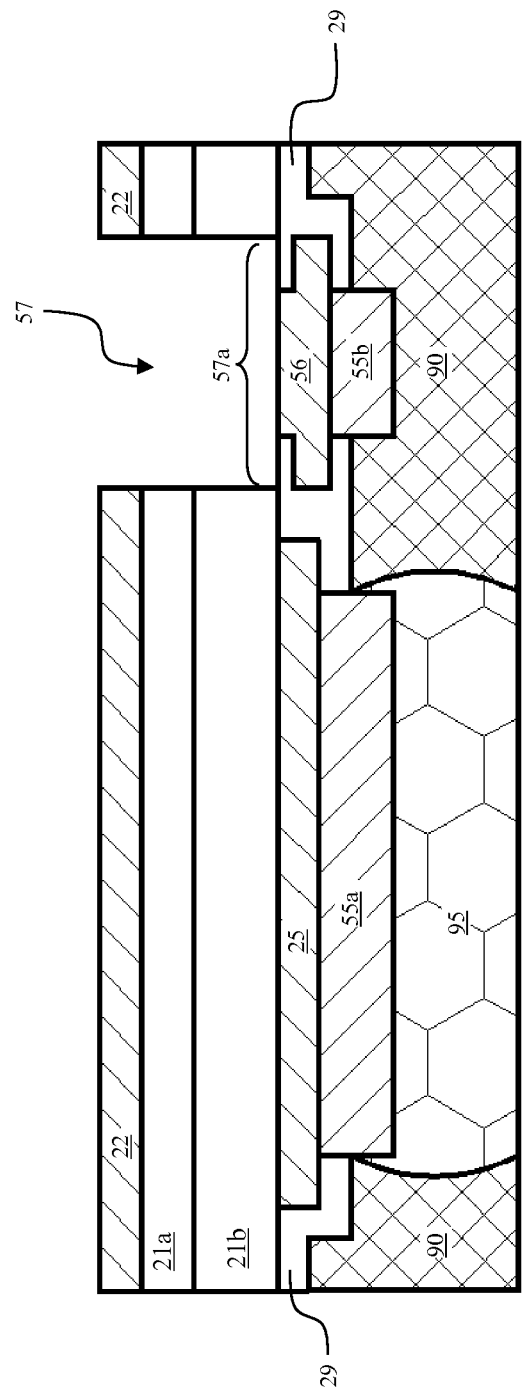
Fig. 6 Present Invention

SEMICONDUCTOR DEVICE WITH SUBSTRATE-SIDE EXPOSED DEVICE-SIDE ELECTRODE AND METHOD OF FABRICATION

CROSS REFERENCE TO RELATED APPLICATIONS

This application is related to the following patent applications:
Title: "A Multi-die DC-DC Boost Power Converter with Efficient Packaging" by Francois Hebert et al with application Ser. No. 11/830,951, filing date: Jul. 31, 2007, hereinafter referred to as U.S. application Ser. No. 11/830,951
Title: "Virtually Substrate-less Composite Power Semiconductor Device and Method" by Tao Feng et al with application Ser. No. 12/749,696, filing date: Mar. 30, 2010, hereinafter referred to as U.S. application Ser. No. 12/749,696
whose contents are incorporated herein by reference for any and all purposes.

FIELD OF INVENTION

This invention relates generally to the field of semiconductor device structure. More specifically, the present invention is directed to device structure and manufacturing method to form power semiconductor devices that simplify post-wafer processing, such as power Metal-Oxide-Semiconductor Field Effect Transistor (MOSFET) and Insulated Gate Bipolar Transistor (IGBT).

BACKGROUND OF THE INVENTION

For system level packaging of a power MOSFET device, sometimes a bottom source power MOSFET is needed to optimize chip arrangement and/or to reduce packaging-related parasitic interconnecting impedance. Such an example can be found in U.S. application Ser. No. 11/830,951 that, inter alia, described a multi-die semiconductor package for DC-DC boost converter application having a lead-frame with a grounded die pad; a vertical bottom source N-channel MOSFET placed atop the die pad; and an anode-substrate Schottky diode with its anode connected to the drain of the vertical MOSFET. The Schottky diode die and the vertical MOSFET die are co-packaged atop the single die pad in a stacked way with the Schottky diode die atop the vertical MOSFET die for minimized vertical MOSFET source inductance and easy heat sinking. However, as the source and gate are usually formed on the top of the die in the art, it is difficult to simply mount the MOSFET die upside down due to difficulties in making contact to the gate pad.

As it offers advantages of bulk device electrical resistance reduction, bulk device thermal resistance reduction while maintaining low profile, the ability of making thin chips with a reduced substrate thickness of power semiconductor devices has also become very desirable in the semiconductor industry.

Fig. A is a cross sectional view of a bottom-source lateral diffusion MOS (BS-LDMOS) device described in U.S. Pat. No. 7,554,154, entitled "Bottom source LDMOSFET structure and method" by Hebert et al. and granted on Jun. 30, 2009. An implanted deep sinker region 115 is used to achieve the bottom-source device configuration. The BSLDMOS device is supported on a P+ substrate 105 functioning as a bottom source electrode. A layer of P− epitaxial layer 110 is supported on top of the substrate 105. A deep sinker region 115 doped with P+ dopant ions below an active cell area in the device is formed in the epitaxial layer at a depth and extended laterally to a bottom of a drain drift region 125 to compensate some of the N− dopant in the accumulation of the transistor for tailoring a dopant profile of N-drift region 125 to minimize the gate-drain capacitance while maintaining a low drain to source resistance R.sub.dson. The deep sinker region 115 further extends vertically both downward to the bottom P+ substrate 105, and upward to a body region 150 that forms a channel at a top surface under a gate oxide 135. The sinker regions 115 functions as a combined channel and also as a buried source body contact for contacting to a P+ body contact region 155 that is formed near the top surface formed as a top trench covered by a source metal 170-S surrounded by N+ doped source region 160. A terrace-shaped gate 140 surrounded by a gate spacer 165 and covered by a gate shield metal 170-G is disposed above the gate oxide layer 135 formed on the top surface between the source region 160 and the drain drift region 125. The gate 140 thus controls the current flow between the source region 160 and the drain drift region 125 through the channel form by body region 150 under the gate 140 to function as a lateral MOS device. The drain region 125 is disposed below a field oxide 130 covered by a BPSG layer 180 and optionally a passivation layer 185. A drain contact opening is etched through the passivation layer 185 and the BPSG layer 180 for the top drain metal 199 to contact the drain region 125 via a contact N+ dopant region 190 with reduce contact resistance. The terrace-shaped oxide 130 and 135 below the terrace gate 140 as shown may be formed by different methods. The methods include the processes of growing or depositing the oxide and etching from the channel region or by using a LOCOS type of oxide deposition process. The terrace-shaped gate 140 has a longer gate length and field plating over the drain extension without increasing the cell pitch. The terrace gate 140 provides necessary link for current to flow between the channel and the drain under the gate oxide 135 and field oxide 130 with reduced gate-drain capacitance. However, the corresponding cell pitch is a concern with such structure and approach. That is, the achievable cell pitch can be too large as the sinker region 115 takes up too much room.

With the advent of through substrate via (TSV) technology in the prior art such as illustrated in Fig. B, a bottom source power MOSFET device can now be made by flipping the chip over so its device-side is facing down and having its device-side gate metal (bottom) re-routed, with an isolated conductive via, to its substrate-side gate metal (top). Otherwise, there is basically no change to other parts of the device structure nor to its front end fabrication process. As an example, the structure of the isolated conductive via can be an oxide-lined metal fill. Notwithstanding these advantages, the isolation of TSV and associated fabrication steps on the backside of a thinned wafer still undesirably bring up process complexity and cost. Therefore, device structure and process steps simpler than these prior arts are still desired.

SUMMARY OF THE INVENTION

A semiconductor device with substrate-side exposed device-side electrode (SEDE) is proposed. The semiconductor device has:
  A semiconductor substrate (SCS) having a device-side, a substrate-side opposite the device side and a semiconductor device region (SDR) located at the device-side.
  Numerous device-side electrodes (DSE) formed upon the device-side and in contact with the SDR for operation of the semiconductor device.

At least one through substrate trench (TST) extending through the SCS, reaching a DSE thus turning it into an SEDE.

For packaging the semiconductor device, the SEDE can be interconnected via a conductive interconnector through the TST. The conductive interconnector can be a bond wire, a bonding clip or a solder bump.

In a more specific embodiment, the semiconductor device includes a substrate-side electrode (SSE) in contact with the substrate-side and a windowed substrate-side passivation (SSPV) atop the SSE. The SSPV defines an exposed area of the SSE for spreading a solder material in there during post-wafer processing packaging. The semiconductor device can be a vertical semiconductor device, with the main current moving from the top to the bottom of the device or vice-versa.

In a preferred embodiment, the semiconductor device includes a device-side passivation (DSPV) beneath thus covering the device-side of SEDE. Corresponding to at least one SEDE, a pre-determined member of the DSEs, other than the one SEDE, is provided with an extended support ledge, stacked below while separated from the one SEDE with the DSPV, for structurally supporting the one SEDE during post-wafer processing packaging. Additionally, it is desirable that the projected footprint of the extended support ledge onto the major SCS plane essentially encloses the corresponding projected footprint of the SEDE.

In another preferred embodiment, the TST has a width $TST_W$, along the major SCS plane, and a depth $TST_D$, perpendicular to the major SCS plane, a preferred aspect ratio $TST_W/TST_D$ ranges from about 0.2 to about 20.

In a more specific embodiment, the semiconductor device is a bottom source Metal-Oxide-Semiconductor Field Effect Transistor (MOSFET) having a substrate-side drain electrode (SSDE) in contact with the SCS and correspondingly:

The SDR has a source region, a gate region and a body region.

The DSEs has:
a source electrode contacting the source region plus the body region and having the extended support ledge.
a SEDE contacting the gate region.

In an extended embodiment, the semiconductor device further includes, on its device side, a bonded device-side carrier (DSC) via an insulating intervening bonding layer (IIBL). Where:

The SCS has a virtually diminishing thickness $T_{SCS}$ in that it is comparable to thickness of the SDR $T_{SDR}$.

The DSC has patterned back-face carrier metallizations contacting a DSE other than an SEDE, a patterned front-face carrier metallization pad and numerous through-carrier conductive vias respectively connecting the back-face carrier metallizations to the front-face carrier metallization pad.

The DSC has a thickness $T_{DSC}$ large enough so as to provide sufficient structural rigidity to the semiconductor device, the diminishing thickness $T_{SCS}$ effects a low back substrate resistance, and the through-carrier conductive vias effect a low front-face contact resistance to the contacted DSE.

A method is proposed for making a semiconductor device with at least one substrate-side exposed device-side electrode (SEDE) for facilitating interconnection to an external environment. The method includes:

a) Fabricating a semiconductor device region (SDR) within the device-side of a semiconductor substrate (SCS).

b) Forming numerous device-side electrodes (DSE) and a device-side passivation (DSPV) upon the device-side and in contact with the SDR for operation of the semiconductor device and with the DSPV isolating the DSEs from one another.

c) Creating at least one through substrate trench (TST) extending through the SCS, reaching a pre-determined DSE thus turning it into the SEDE.

In a more specific embodiment, creating the TST involves:

Applying and patterning a windowed trench mask atop the SCS with the mask window equal to the footprint of TST.

Directionally etching through portion of the SCS and the SDR inside the mask window but terminated at the SDR-SEDE interface and the SDR-DSPV interface thus creating the TST.

Removing the windowed trench mask.

In an additional embodiment, between steps b) and c) above, a selected DSE, other than the pre-determined DSE, is extended with a lateral extended support ledge, atop the DSPV, till it essentially covers up the device-side surface of the SEDE beneath the DSPV. This can be done by plating a metal, through a windowed mask, atop the device-side surface of the selected DSE till formation of the extended support ledge.

In another specific embodiment, a method is proposed for making a bottom source MOSFET of thin thickness $T_{MOSFET}$. The bottom source MOSFET has a substrate-side exposed device-side gate electrode (SEDGE) for facilitating interconnection to an external environment during post-wafer processing packaging. The method includes:

a) Providing an interim semiconductor substrate (ISS) of thickness $T_{ISS} > T_{MOSFET}$ and with $T_{ISS}$ large enough for compatibility with a conventional semiconductor wafer process.

b) Successively fabricating, with a conventional semiconductor wafer process atop the ISS, a MOSFET device region (FETDR) plus a device-side source electrode (DSSE), a device-side gate electrode (DSGE) and a device-side passivation (DSPV) atop the FETDR with:
The DSGE located adjacent to the DSSE.
The DSPV isolates the DSGE and DSSE from each other.
The DSPV further covers the device-side surface of DSGE.

c) Thinning the ISS, on its back side, into a semiconductor substrate SCS of desired thickness $T_{SCS} \sim T_{MOSFET}$ and forming a substrate-side drain electrode (SSDE) on it.

d) Creating a through substrate trench (TST) extending through the SSDE, the SCS plus the FETDR and exposing the substrate-side of the DSGE hence making it into the SEDGE.

In a more specific embodiment, creating the TST involves:

Attaching a temporary support substrate atop the device-side of the device-in-progress and flipping it upside down.

Applying, patterning a windowed trench mask atop the SSDE with the mask window equal to the footprint of TST and etching away portion of the SSDE inside the mask window but terminated at the SSDE-SCS interface.

Directionally etching through portion of the SCS and the FETDR inside the mask window but terminated at the FETDR-DSGE interface and the FETDR-DSPV interface thus creating the TST.

Removing the windowed trench mask.
Removing the temporary support substrate.

In a related improvement of the above before applying and patterning the windowed trench mask, a windowed substrate-side passivation (SSPV) can be formed atop the SSDE defining an exposed area of the SSDE for spreading a solder material on it during post-wafer processing packaging of the bottom source MOSFET.

In another embodiment, a semiconductor device is proposed having:
- a first conductive pad on a first side of a semiconductor die;
- a trench under the first conductive pad wherein the semiconductor material is removed, wherein the first pad is exposed from a second side, the second side being on the opposite side of the semiconductor die; and
- an external conductive interconnector attached to the conductive pad from the second side.

In a more specific embodiment, the external conductive interconnector is a bond wire, conductive clip, conductive ribbon, or solder bump. In another more specific embodiment the external conductive interconnector is at least partially located in the trench, with a first end connected to the first pad, and a second end emerging from the trench on the second side of the semiconductor die.

In another more specific embodiment, the semiconductor device may be a vertical field effect transistor (FET), and the first pad is a gate pad. The location of the gate pad may be surrounded or partially surrounded by an active area of the FET. The semiconductor device may further include a supporting structure over the gate pad. The gate pad may be completely surrounded by the active area of the device, and the supporting structure may be an extended source electrode. The external conductive interconnector may be a bond wire, conductive clip, conductive ribbon, or solder bump.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

Fig. A is a cross sectional view of a first prior art trenched bottom-source lateral diffusion MOS (BS-LDMOS) device described in U.S. Pat. No. 7,554,154;

Fig. B is a cross sectional view of a second prior art bottom source power MOSFET device using through substrate via (TSV) technology;

Fig. C is a cross sectional view of a prior art bottom drain power MOSFET device with multiple trenched gates;

FIG. 1 illustrates a cross sectional view of an embodiment of the present invention bottom source power MOSFET device with multiple trenched gates;

FIG. 1A illustrates a cross sectional view of an alternative embodiment of the present invention bottom source power MOSFET device with multiple trenched gates;

FIG. 2A illustrates a cross sectional view of a first embodiment of the present invention bottom source power MOSFET device;

FIG. 2B illustrates the post wafer process packaging of the device embodied in FIG. 2A using a bond wire;

FIG. 2C illustrates a semiconductor package including the present invention bottom source power MOSFET device;

FIG. 3A through FIG. 3H illustrate a fabrication process for making the device embodied in FIG. 2A;

FIG. 4 illustrates a cross sectional view of a second embodiment of the present invention bottom source power MOSFET device;

FIG. 5 illustrates a cross sectional view of a third embodiment of the present invention bottom source power MOSFET device with the addition of a device-side carrier; and FIG. 6 illustrates a cross sectional view of yet another embodiment of a bottom source power MOSFET of the present invention.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Fig. C is a cross sectional view of a prior art bottom drain power MOSFET device 1 with an active portion 1a and a gate interconnect portion 1b both built on top of a semiconductor substrate (SCS) 21 with a bottom drain metal layer 22. The active portion 1a has, within a semiconductor device region (SDR) 3 of the SCS 21, multiple interdigitated source-body regions 23 and trenched gate regions 24 built on top of the SCS 21. In this example, the SCS 21 may comprise of a lightly-doped epitaxial drift layer 21b over a heavily-doped contact layer 21a. The multiple source-body regions 23 are in contact and parallely connected to a patterned intimate source electrode 25. Likewise, although not shown here with connection specifics to avoid unnecessary obscuring details to those skilled in the art, the trenched gate regions 24 of the active portion 1a are parallely connected, in the third dimension (X-Y plane) and via a trenched gate runner region 24a, to a patterned gate electrode 26 of the gate interconnect portion 1b located beneath a device-side passivation (DSPV) 29. Device-side insulations 28a, 28b are located atop the SCS 21 for respectively isolating the patterned gate electrode 26 and the patterned intimate source electrode 25 from semiconductor device structures below except where contact is desired.

FIG. 1 illustrates a cross sectional view of the present invention bottom source power MOSFET 31 with an active portion 31a and a gate interconnect portion 31b both built upon a semiconductor substrate (SCS) 21 with a drain metal layer 22. Though not shown here, the bottom source power MOSFET 31 may be flipped upside down after front side processing. It should be clear that the active portion 31a of bottom source power MOSFET 31 is similar to the active portion 1a of bottom drain power MOSFET device 1 except for the addition of a patterned source electrode 55 upon and in electrical contact with the patterned intimate source electrode 25. Within the gate interconnect portion 31b a through substrate trench (TST) 57 has been extended through the SCS 21, reaching a substrate-side exposed device-side gate electrode (SEDGE) 56 with an exposed SEDGE portion 56a. The TST 57 has a TST footprint 57a and can be geometrically characterized by a depth of $TST_D$ and a width of $TST_W$.

Corresponding to the SEDGE 56, the patterned source electrode 55 has also been extended to the gate interconnect portion 31b with an extended support ledge 55a that is stacked below while separated from the SEDGE 56 with the DSPV 29. Additionally, it is desirable that the projected footprint (X-Y plane) of the extended support ledge 55a essentially encloses the corresponding projected footprint of the SEDGE 56. Thus, the extended support ledge 55a can structurally support the SEDGE 56 during post-wafer processing packaging of the bottom source power MOSFET 31.

FIG. 1A illustrates a cross sectional view of an alternative embodiment of the present invention in which the gate interconnector portion 31b including TST 57 is located between active portions 31a. Thus, the source electrode 55 has an extended support ledge 55a which may completely cover and reinforce the TST 57.

FIG. 2A illustrates a cross sectional view of a first embodiment of a bottom source power MOSFET 35 under the present invention. Given the illustration of FIG. 1, from now on the detailed illustration of the device side (e.g. source-body regions, gate trenches, etc.) of the bottom source power MOSFET device is omitted for those skilled in the art for simplicity of illustration. As a remark, FIG. 2A is flipped over with respect to FIG. 1. As specific examples, the SCS 21 can be made of silicon with a heavily-doped contact layer 21a and a lightly-doped drift layer 21b made of an epitaxial growth atop the heavily-doped contact layer 21a. The drain metal layer 22 can be made of titanium-nickel-silver (TiNiAg). The patterned intimate source electrode 25 and SEDGE 56 can be made of aluminum-copper (AlCu). The DSPV 29 can be made of an oxide and/or polyimide. The patterned source electrode 55 can be made of copper (Cu). Some related geometric parameter ranges are: DSPV 29 thickness~1 micron to 10 microns; thickness of the extended support ledge 55a~5 micron to 20 microns. The extended support ledge 55a may completely overlap and even extend beyond the SEDGE 56 to provide extra support.

FIG. 2B illustrates the post wafer process packaging of the bottom source power MOSFET 35 with the active portion omitted. In this example, connection to the SEDGE 56 is via a conductive interconnector 33 (e.g., a bond wire) through the TST 57. To those skilled in the art the conductive interconnector 33 can instead be a bonding plate or a solder bump as well for as long as the $TST_D$ and $TST_W$ can accommodate the conductive interconnector and its associated packaging tool. In this regard, a preferred aspect ratio TSTW/TSTD can range from about 0.2 to about 20. As a more specific embodiment, $TST_W$ can range from about 100 micron to about 500 micron and $TST_D$ can range from about 25 micron to about 500 micron. It is further remarked that, while the TST 57 can be lined with an insulating material to passivate the otherwise exposed surfaces of SCS 21 if so desired (referencing U.S. application Ser. No. 12/749,696), the TST 57 can, as part of post wafer process packaging, be filled with a molding compound surrounding the bond wire 33 and simultaneously passivating the SCS 21.

By way of example, FIG. 2C illustrates a semiconductor package 50 including the bottom source power MOSFET 35 and a lead frame 32. The bottom source power MOSFET 35 is mounted upon a lead frame segment 32b which can act as a die pad. The intimate source electrode 25 is thus connected to lead frame segment 32b, (e.g., by mounting the patterned source electrode 55 on segment 32b). The Gate electrode (SEDGE 56) is connected to the lead frame segment 32c by any suitable conductive interconnector 33a such as bond wire, conductive ribbon, bonding clip, etc through the TST 57. The drain metal layer 22 may also be connected to a lead frame segment 32a by a conductive interconnector 36 which may also include bond wire, conductive ribbon, bonding clip, etc. If desired, other semiconductor dies (not shown) may be co-packaged with bottom source power MOSFET 35. Afterwards, a molding compound 37 (the outline of which is indicated by the dashed line) may encapsulate the package 50. The molding compound 37 can also fill in the TST 57.

FIG. 3A through FIG. 3H illustrate a fabrication process for making the bottom source power MOSFET device embodied in FIG. 2A. In FIG. 3A a MOSFET device region (FETDR) 71, together with patterned intimate source electrode 25, patterned gate electrode 26 and DSPV 29, are fabricated with a conventional semiconductor wafer process at the top of an interim semiconductor substrate (ISS) 70 with thickness $T_{ISS}$ large enough for compatibility with the conventional semiconductor wafer process. As a typical example, $T_{ISS}$ may be in the range of 600-800 micron. The patterned intimate source electrode 25 is located adjacent to the patterned gate electrode 26 while isolated from it by the DSPV 29 that also covers the device-side surface of the patterned gate electrode 26.

In FIG. 3B the patterned intimate source electrode 25 is extended with an extended support ledge 55a, atop the DSPV 29, till it essentially covers up the device-side surface of the patterned gate electrode 26 beneath the DSPV 29. This can be done by plating a metal, through a windowed mask (omitted here to simplify viewing), atop the device-side surface of the patterned intimate source electrode 25 till formation of the extended support ledge 55a. As a specific example, a masked thick Copper (Cu) plating process can be used. Furthermore, the thick Cu plating may be followed by chemical mechanical polishing (CMP) to level the plated top surface and additionally followed by formation of a nickel-gold (Ni—Au) layer or a thin solder layer to prevent copper oxidation.

In FIG. 3C the back side of interim semiconductor substrate (ISS) 70 is thinned down into a SCS 21 of desired thickness $T_{SCS}$. A substrate-side drain metal layer 22 is then formed upon the substrate-side (i.e. the side opposite the device side) of SCS 21. As an example, $T_{SCS}$ can be made down to a range of 50 micron-300 micron with a back grinding process and the drain metal layer 22 made of titanium-nickel-silver (Ti—Ni—Ag).

FIG. 3D through FIG. 3G illustrate the creation of a TST 57 extending through the drain metal layer 22, the SCS 21 including the MOSFET device region (FETDR) 71 and exposing the SEDGE 56. In FIG. 3D a temporary support substrate 72 is attached to the device-side of the device-in-progress and oriented so that the substrate (drain) side is facing up. As examples, the temporary support substrate 72 can be made of glass, silicon or more generally a handle wafer.

In FIG. 3E a windowed trench mask 74 is applied and patterned atop the drain metal layer 22 with a mask window 75 equal to the intended TST footprint 57a (X-Y plane) of the TST 57. As an example, the windowed trench mask 74 can be a photoresist.

In FIG. 3F a portion of the drain metal layer 22 inside the mask window 75 is etched away with etching terminated at the drain metal layer 22-SCS 21 interface.

In FIG. 3G a portion of the SCS 21 and the FETDR 71 under the mask window 75 are directionally etched through with etching terminated at the FETDR 71-SEDGE 56 interface and the FETDR 71-DSPV 29 interface thus creating the TST 57. As an example, plasma etching can be used here with some tapering of the vertical trench walls allowed. In a more specific embodiment, $TST_D$ can range from 100 micron to 300 micron, typical $TST_W$ can range from 150 micron to 200 micron with a minimum of about 100 micron.

In FIG. 3H the windowed trench mask 74 is stripped off followed by debonding and removal of the temporary support substrate 72 resulting in a bottom source power MOSFET of desired thickness $T_{MOSFET}$.

FIG. 4 illustrates a cross sectional view of another embodiment of a bottom source power MOSFET portion 33b under the present invention. Here, a windowed substrate-side passivation (SSPV) 27 are added atop the drain metal layer 22 thus defining an exposed drain metal area 80 for spreading and constraining a solder material flow in there during post-wafer processing packaging. As for example, the SSPV 27 can be made of an oxide, nitride or polyimide. During the fabrication process, the SSPV 27 can be formed before the windowed trench mask 74 is applied and patterned atop the drain metal layer 22 (FIG. 3E).

FIG. 5 illustrates a cross sectional view of yet another embodiment of a bottom source power MOSFET portion 34b with the addition of a device-side carrier (DSC) 40. While the structure of the bottom source power MOSFET portion 34b is about the same as that illustrated in FIG. 2A except for the absence of its extended source electrode 55 and its extended support ledge 55a, a device-side carrier (DSC) 40 made of a carrier material 40a is added, (e.g. via an insulating intervening bonding layer (IIBL) 60), upon its device side. With reference made to U.S. application Ser. No. 12/749,696 for further details, the following features should be readily recognized by those skilled in the art:

- The SCS 21 can be made with a diminishing thickness $T_{SCS}$ in that it is comparable to thickness of the semiconductor device region $T_{SDR}$, owing to the structural rigidity of the DSC 40.
- The device-side carrier (DSC) 40 has numerous patterned back-face carrier metallizations 41a, 41b, 41c contacting the patterned intimate source electrode 25, a patterned front-face carrier metallization pad 42a and numerous through-carrier conductive vias 43a, 43b, 43c respectively connecting the patterned back-face carrier metallizations 41a, 41b, 41c to the patterned front-face carrier metallization pad 42a.
- The DSC 40 can be made with a thickness $T_{DSC}$ large enough so as to provide sufficient structural rigidity to the semiconductor device, the virtually diminishing thickness $T_{SCS}$ effects a low back substrate resistance, and the through-carrier conductive vias 43a, 43b, 43c effect a low front-face contact resistance to the contacted patterned intimate source electrode 25.

Another unobvious feature is that, as the SEDGE 56 did not need to be covered by the DSPV 29 during wafer processing of the bottom source power MOSFET portion 34b, the then-top-exposed SEDGE 56 simplifies a related wafer-level probing test before attachment of the DSC 40. As for some more specific embodiments, $T_{DSC}$ can range from about 100 micron to about 400 micron. $T_{SCS}$ can range from about 5 micron to about 100 micron, and can be less than 50 microns without danger of breakage owing to the rigidity of the DSC 40.

FIG. 6 illustrates a cross sectional view of yet another embodiment of a bottom source power MOSFET similar to FIG. 5 but in which the DSC 40 is replaced by molding compound 90 surrounding a solder bump 95 making connection to the intimate source electrode 25 by way of source electrode 55a. Optionally, a gate electrode 55b may be formed on SEDGE 56 as a side product of forming the source electrode 55a, but no connection is made to it from the source electrode 55a or from the solder bump 95. The added source electrode 55a may beneficially allow good connection to the solder bump 95 solder material.

While the description above contains many specificities, these specificities should not be construed as accordingly limiting the scope of the present invention but as merely providing illustrations of numerous presently preferred embodiments of this invention. For example, in addition to power MOSFET devices with trenched gates, the present invention concept of bottom source power MOSFET expects to be applicable to other device varieties of lateral double-diffused MOSFET (LDMOS) and vertical double-diffused MOSFET (VDMOS) as well. For another example, the present invention concept also expects to be applicable to the structure and fabrication of Micro Electro Mechanical System (MEMS). Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A semiconductor device with substrate-side exposed device-side electrode (SEDE), the semiconductor device comprising:
   a semiconductor substrate (SCS) having a device-side, a substrate-side opposite the device side and a semiconductor device region (SDR) located at the device-side;
   a plurality of device-side electrodes (DSE) formed upon the device-side and in contact with the SDR for operation of the semiconductor device;
   at least one through substrate trench (TST) extending through the SCS, reaching a DSE thus turning it into an SEDE; and
   a device-side passivation (DSPV) and, corresponding to at least one SEDE, a pre-determined member of the DSEs, other than said at least one SEDE, comprises an extended support ledge, stacked below while separated from said at least one SEDE with the DSPV, for structurally supporting said at least one SEDE during post-wafer processing packaging
   whereby the SEDE can be interconnected via a conductive interconnector through the TST.

2. The semiconductor device of claim 1 wherein the projected footprint, onto the major SCS plane, of the extended support ledge essentially encloses the corresponding projected footprint of the SEDE.

3. A semiconductor device with substrate-side exposed device-side electrode (SEDE), the semiconductor device comprising:
   a semiconductor substrate (SCS) having a device-side, a substrate-side opposite the device side and a semiconductor device region (SDR) located at the device-side;
   a plurality of device-side electrodes (DSE) formed upon the device-side and in contact with the SDR for operation of the semiconductor device; and
   at least one through substrate trench (TST) extending through the SCS, reaching a DSE thus turning it into an SEDE
   whereby the SEDE can be interconnected via a conductive interconnector through the TST; the semiconductor device further comprising a substrate-side drain electrode (SSDE) in contact with the SCS and correspondingly:
   the SDR comprises a source region, a gate region and a body region; and
   the DSEs comprise:
      a source electrode contacting the source region and the body region; and
      a SEDE contacting the gate region whereby making the semiconductor device a bottom source Metal-Oxide-Semiconductor Field Effect Transistor (MOSFET); and wherein the source electrode further comprises an extended support ledge supporting the SEDE.

4. A semiconductor device with substrate-side exposed device-side electrode (SEDE), the semiconductor device comprising:
a semiconductor substrate (SCS) having a device-side, a substrate-side opposite the device side and a semiconductor device region (SDR) located at the device-side;
a plurality of device-side electrodes (DSE) formed upon the device-side and in contact with the SDR for operation of the semiconductor device; and
at least one through substrate trench (TST) extending through the SCS, reaching a DSE thus turning it into an SEDE
whereby the SEDE can be interconnected via a conductive interconnector through the TST; and
the semiconductor device further comprising, on its device side, a bonded, via an insulating intervening bonding layer (IIBL), device-side carrier (DSC) wherein:
the SCS has a diminishing thickness $T_{SCS}$ along the length compared to the thickness of the SDR $T_{SDR}$;
the DSC has patterned back-face carrier metallizations contacting a DSE other than an SEDE, a patterned front-face carrier metallization pad and a plurality of through-carrier conductive vias respectively connecting the back-face carrier metallizations to the front-face carrier metallization pad; and
the DSC has a thickness $T_{DSC}$ large enough
whereby the DSC provides sufficient structural rigidity to the semiconductor device, the diminishing thickness $T_{SCS}$ effects a low back substrate resistance, and the through-carrier conductive vias effect a low front-face contact resistance to the contacted DSE.

5. A method of making a semiconductor device with at least one substrate-side exposed device-side electrode (SEDE) for facilitating interconnection to an external environment, the method comprises:
a) providing a semiconductor substrate (SCS) and fabricating, within its device-side, a semiconductor device region (SDR);
b) forming a plurality of device-side electrodes (DSE) in contact with the SDR for operation of the semiconductor device; and
c) creating at least one through substrate trench (TST) extending through the SCS, reaching a pre-determined DSE thus turning it into said at least one SEDE; and
the method further comprises, between steps b) and c):
b1) extending a selected DSE, other than said pre-determined DSE, with a lateral extended support ledge, till it essentially covers up the device-side surface of said at least one SEDE, with a device-side passivation (DSPV) being located between and separating the extended support ledge from the SEDE.

6. The method of claim 5 wherein extending the selected DSE comprises plating a metal, through a windowed mask, atop the device-side surface of the selected DSE till formation of the extended support ledge.

7. A semiconductor device having:
a semiconductor die made of a semiconductor material and having a first side and a second side;
a conductive first pad located on the first side of the semiconductor die;
a trench under the conductive first pad wherein the semiconductor material is removed, through said trench the first pad is exposed from the second side of the semiconductor die; and
an external conductive interconnector attached to said conductive first pad through said trench from said second side;
wherein said semiconductor device is a vertical field effect transistor (FET), said first pad is a gate pad, and the location of the gate pad is at least partially surrounded by an active area of the FET.

8. The semiconductor device of claim 7 further comprising a supporting structure over the gate pad.

9. The semiconductor device of claim 7 wherein the external conductive interconnector is a bond wire, conductive clip, conductive ribbon, or solder bump.

10. There semiconductor device of claim 1 wherein the semiconductor device is a vertical semiconductor device.

11. The semiconductor device of claim 1 further comprising a substrate-side electrode (SSE) in contact with the substrate-side.

12. The semiconductor device of claim 1 wherein the conductive interconnector is a bond wire, a bonding clip, a conductive ribbon or a solder bump.

13. The semiconductor device of claim 3 further comprising a device-side passivation (DSPV) at the device-side of SEDE.

14. The semiconductor device of claim 4 wherein the TST has a width $TST_W$, along the major SCS plane, and a depth $TST_D$, perpendicular to the major SCS plane, with an aspect ratio $TST_W/TST_D$ from about 0.2 to about 20.

15. The semiconductor device of claim 14 wherein the width of TST, $TST_W$, is from about 100 micron to about 500 micron and the depth of TST, $TST_D$, is from about 25 micron to about 500 micron.

16. The method of claim 5 wherein creating the TST comprises:
directionally etching through a portion of the SCS and the SDR inside a pre-determined mask window but terminated at the SDR-SEDE interface thus creating the TST.

17. The semiconductor device of claim 7 wherein the external conductive interconnector is a bond wire, conductive clip, or conductive ribbon, or solder bump.

18. The semiconductor device of claim 7 wherein the external conductive interconnector is at least partially located inside said trench, with a first conductive interconnector end connected to the first pad, and a second conductive interconnector end emerging from said trench on the second side of the semiconductor die.

* * * * *